United States Patent [19]

Beilstein, Jr. et al.

[11] 4,092,548

[45] May 30, 1978

[54] SUBSTRATE BIAS MODULATION TO IMPROVE MOSFET CIRCUIT PERFORMANCE

[75] Inventors: Kenneth Edward Beilstein, Jr.; Harish Narandas Kotecha, both of Manassas, Va.

[73] Assignee: International Business Machines Corporation, Armonk, N.Y.

[21] Appl. No.: 777,793

[22] Filed: Mar. 15, 1977

[51] Int. Cl.² .................... H03K 19/40; H03K 3/353; H01L 29/78

[52] U.S. Cl. .................................... 307/205; 307/214; 307/251; 307/304; 307/DIG. 4; 357/41

[58] Field of Search ............... 307/205, 214, 246, 251, 307/304, DIG. 4; 330/277; 357/41

[56] References Cited

U.S. PATENT DOCUMENTS

| | | | |
|---|---|---|---|
| 3,506,851 | 4/1970 | Polkinghorn et al. | 307/251 |
| 3,775,693 | 11/1973 | Proebsting | 307/304 X |
| 3,898,477 | 8/1975 | Buchanan | 307/304 X |
| 3,911,289 | 10/1975 | Takemoto | 307/304 X |
| 3,912,948 | 10/1975 | Bapat | 307/205 X |
| 3,980,896 | 9/1976 | Kato | 307/214 X |
| 4,049,978 | 9/1977 | Dru et al. | 307/205 X |
| 4,049,980 | 9/1977 | Maitland | 307/304 |

OTHER PUBLICATIONS

Frantz, "Threshold Voltage Control for N—Channel MOSFET Devices", IBM Tech. Discl. Bull.; vol. 12, No. 12, pp. 2078; 5/1970.

Kubo et al., "A Threshold Voltage Controlling Circuit for Short Channel MOS Integrated Circuits", 1976 IEEE Int'l Solid—State Circuits Conf., pp. 54–55; 2/1976.

*Primary Examiner*—Larry N. Anagnos
*Attorney, Agent, or Firm*—John E. Hoel

[57] ABSTRACT

A load device characteristic is improved for a static inverter by reducing the load device threshold voltage as the output voltage increases from its initial value. The circuit structure to accomplish this is an isolated substrate within which the FET load device is located, that substrate being connected to an inverter circuit for raising the voltage of the substrate as the source potential increases for the preferred depletion mode load device. The particular circuit is a two-stage inverter, the first stage being a modulating signal source, the output of the first stage inverter being connected to the isolated substrate of the FET load for a second inverter, so that the FET load device for the second stage inverter has its substrate modulated so that the magnitude of the substrate potential changes at a faster rate than does the source potential. This tracking of the potential of the substrate with respect to the potential of the source of the device decreases the threshold voltage as the output voltage of the second stage increases.

16 Claims, 8 Drawing Figures

SUBSTRATE BIAS MODULATION TO IMPROVE MOSFET CIRCUIT PERFORMANCE

FIELD OF THE INVENTION

The invention disclosed is directed to monolithic IGFET circuits and more particularly to IGFET logic circuits.

BACKGROUND OF THE INVENTION

One of the major disadvantages associated with IGFET inverter circuits has been their relatively poor current driving capability. The IGFET device is a modulated resistor and consequently IGFET circuits exhibit large RC time constants, particularly during their turn-off transition when driving capacitive loads. This deficiency becomes substantial when the IGFET inverter is used as an off-chip driver for a large scale integrated circuit, charging secondlevel package capacitances. Several IGFET inverter circuits are available from the prior art. They are briefly reviewed in what follows.

The simplest IGFET inverter circuit consists of a resistor connected in series with an enhancement mode IGFET. The circuit is completed by connecting the source of the IGFET to a reference or ground potential and the resistor to a drain voltage supply. The output voltage of this circuit is taken at the interconnection node between resistor and IGFET. When the enhancement mode transistor is in its off state, the output is at the drain voltage supply which is typically referred to as the logic "one" level. When the enhancement mode IGFET is switched on, the output is pulled down (N-channel) to a level near the reference voltage, which is typically referred to as the logic "zero" level. The logic "zero" level depends on the ratio between the resistance of the enhancement mode IGFET and the load resistor. Although the use of a simple resistor for load has the advantage that one of the output levels is the voltage of the drain supply, the circuit is not practical in integrated circuit form because a diffused region on the chip having resistance sufficiently large to provide a low level of power dissipation, occupies a large surface area.

One substitute for a diffused load resistor is an enhancement mode IGFET, whose gate and drain terminals are connected to the drain voltage supply. However, this circuit has the disadvantage that the logic "one" level of the output can only reach a potential equal to the drain voltage less one threshold voltage of the load IGFET, which is typically greater than one volt. Another disadvantage is that the output current of the load device decreases very rapidly as the magnitude of the output node voltage, which is also the potential of the source terminal of the load IGFET, increases because the load transistor is always biased in its saturated range. This type of inverter circuit is referred to as saturated load.

Another implementation of a load device for an IGFET inverter circuit uses an enhancement mode IGFET, whose gate is connected to a gate voltage supply having a greater magnitude than the drain voltage supply. With this type of voltage bias, the load device is always biased in its linear range and the undesirable drop in load current found in saturated loads is eliminated. Accordingly, this type of inverter circuit is known as linear load. The disadvantage with this approach is that it requires an additional voltage supply.

Another approach by the prior art is the use of a depletion mode IGFET with its gate and source electrically shorted to provide a load current characteristic with more current drive than the previously described load elements. An inverter circuit using this type of load has an enhancement mode IGFET with the same channel conductivity as the depletion mode load device to connect the output node to a source voltage supply. The gate of the enhancement mode device serves as input for the inverter circuit. Because of the gate-to-source short of the depletion mode device, its current output remains substantially constant as the output voltage transitions toward the drain voltage supply, thus enhancing the switching speed of the inverter circuit.

Another IGFET inverter circuit employed in the prior art uses a pair of complementary IGFET devices (CMOS): an N-channel enhancement mode transistor connected to the least positive voltage supply and a P-channel enhancement mode transistor connected to the most positive voltage supply, with the common drains being the output. The gates of the transistors are connected together and receive the input signal. When the input signal is down, the N-channel enhancement mode device is turned off and the P-channel enhancement mode device is turned on so that the output is at the level of the most positive supply voltage. When the input signal is high, the N-channel device is on and the P-channel device is off and the output is at the level of least positive supply voltage.

Since one of the devices of the pair is always off during their steady state, this type of circuit is sometimes categorized as a dynamic type to suggest that it dissipates power only during its switching transients. This is in contrast with all the aforementioned circuits which dissipate power during both their transient and steady state and belong then to the static type of circuit.

A solution to the particular problem of providing IGFET chips with off chip driver circuits having sufficiently large output current to drive second level package capacitances, is to use bipolar transistor devices for the off chip driver in a hybrid IGFET bipolar chip. This solution has not been widely employed because of the higher costs associated with the extra processing needed for bipolar fabrication.

OBJECTS OF THE INVENTION

It is therefore an object of the invention to provide an IGFET inverter circuit having an improved load curve characteristic.

It is another object of the invention to provide inverter circuitry which has devices of the same channel conductivity type and yet exhibits load characteristics similar to those of CMOS inverters.

It is still another object of the invention to provide an IGFET inverter circuit having a reduced delay time per stage of signal propagation.

SUMMARY OF THE INVENTION

These and other objects, features and advantages of the invention are accomplished by the substrate bias modulation invention disclosed herein.

A load device characteristic is improved for an FET inverter by reducing the load device threshold voltage as the output voltage increases from its initial value. The circuit structure to accomplish this is an isolated substrate within which the FET load device is located, that substrate being connected to a means for raising the voltage of the substrate as the source potential increases for the FET load device. The particular circuit disclosed is a two-stage inverter, the first stage being a modulating signal source, the output of the first stage inverter being connected to the isolated substrate of the FET load for a second inverter, so that the FET load device for the second stage inverter has its substrate modulated so that the magnitude of the substrate potential changes at a faster rate than does the source potential. This tracking of the potential of the substrate with respect to the potential of the source of the device, thereby decreases the threshold voltage as the output voltage of the second stage increases.

DESCRIPTION OF THE FIGURES

These and other objects, features and advantages of the invention will be more particularly appreciated with reference to the accompanying figures.

DISCUSSION OF THE PREFERRED EMBODIMENT

The preferred circuits disclosed herein comprise N-channel enhancement and depletion IGFETs. N-channel enhancement mode IGFETs are fabricated by diffusing spaced, N type source and drain regions into a P type substrate, forming an insulating layer such as silicon dioxide over the channel region between the source and drain regions, and then forming a conductive gate electrode over the channel region. Assuming that the source region of such a device is at ground potential, and that the drain region is biased to a positive voltage, the device will conduct whenever the gate-to-source voltage, $V_{GS}$, is more positive than the threshold voltage $V_T$ of the device, where $V_T$ is always designed to be a positive value. When the magnitude of $V_{GS}$ is less than $V_T$, no significant conduction will occur.

N-channel depletion mode IGFETs have the same configuration as above except for the presence of an N-channel between the diffused regions which is commonly fabricated by means of ion-implantation. A process for the implantation of N-channels to fabricate depletion devices is described in L. Forbes, "N-Channel Ion-Implanted Enhancement/Depletion FET Circuit and Fabrication Technology", *IEEE Journal of Solid State Circuits*, Vol. SC-8, June 1973, pages 226–230. N-channel depletion mode devices have a threshold voltage which is always negative so that they conduct for zero and negative gate-to-source voltage.

It is to be understood that the present invention is equally applicable to P-channel transistors as it is to the disclosed N-channel transistor embodiment. The P-channel enhancement and depletion mode devices operate in the same way as the corresponding N-channel counterparts except that the polarity of the voltages is reversed. Accordingly, as disclosed herein, the term low voltage refers to the source voltage which is commonly fixed at ground potential and the term high voltage refers to the drain voltage which is a negative voltage for P-channel devices and a positive voltage for N-channel devices. Occasionally, it will also be convenient to refer to the drain voltage levels as the logical one level, which for a P-channel device would typically range from −5 voltage to −17 volts and for N-channel devices would typically be from +5 volts to +17 volts. Similarly, the source or ground voltage level will be occasionally referred to as the logical zero level; typically from 0 to 2.2 volts, positive for N-channel and negative for P-channel.

Figure 1A:
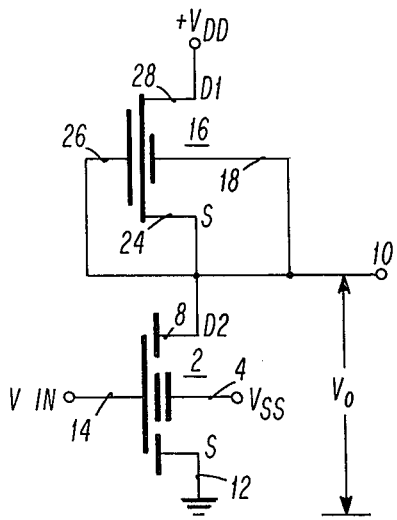
FIG. 1A is a schematic diagram of an IGFET inverter circuit where the load device has an isolated substrate, as disclosed in copending U.S. Pat. application Ser. No. 723,678, filed Sept. 16, 1976, by F. H. De La Moneda, et al., and assigned to the instant assignee.
Figure 1B:
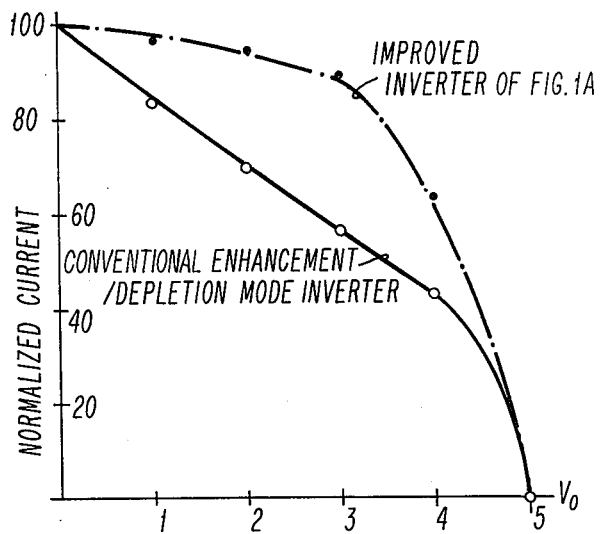
FIG. 1B illustrates the load current characteristic for the circuit of FIG. 1A.

The schematic diagram for an IGFET inverter circuit having a load with an isolated substrate is shown in FIG. 1A and its load current characteristic is shown in FIG. 1B, as disclosed in copending U.S. Pat. application Ser. No. 723,678, filed Sept. 16, 1976 by F. H. De La Moneda, et al., and assigned to the instant assignee. A process for making the FET load with an isolated substrate is also disclosed therein. For the purposes of comparison, the load current characteristic of the state-of-the-art enhancement/depletion inverter is shown in FIG. 1B. The inverter circuit, which is schematically shown in FIG. 1A, can be embodied by a structure shown in cross-section in FIG. 2. The IGFET static inverter circuit of FIG. 1A comprises an enhancement mode IGFET active device 2 in a first portion 4 of the P type semiconductor substrate 6. Enhancement mode IGFET device 2 has its drain 8 connected to an output node 10, its source 12 connected to a source potential, which in the case shown is ground, and its gate 14 connected to an input signal source $V_{IN}$. The first portion 4 of the substrate 6 is connected to a first substrate potential VSS. A depletion mode IGFET load device 16 is located in a second substrate region 18 which is electrically isolated from the first portion 4. A mode of electrical isolation for the depletion mode device 16 is a reversed biased PN junction 20 formed between the N type isolation diffusion 22 and the P type substrate 6. The depletion mode load device 16 has its source 24 and gate 26 connected together and electrically shorted to the isolated substrate 18 which is surrounded by the PN junction 20. The source 24, gate 26 and isolated substrate 18 are connected to the output 10 of the inverter circuit of FIG. 2. The drain electrode 28 is connected to a drain voltage supply $V_{DD}$. The drain voltage $V_{DD}$ may optionally be connected to the N type isolation diffusion 22 to sustain the reverse biased condition thereof with respect to the substrate 4 in which instance the drain electrode diffusion 28 and isolating diffusion 22 should be merged to reduce the area occupied by the load device.

For the inverter circuit in FIG. 1A, both the depletion mode IGFET device 16 and the enhancement mode IGFET device 2 have the same channel type, either P-channel or N-channel.

The circuit of FIG. 1A eliminates the rise in the source-to-substrate bias of the depletion mode load device 16 so as to provide an improved load characteristic for the inverter circuit, as is shown in FIG. 1B.

The reduction in current drive of the conventional enhancement/depletion inverter at high output voltage shown in FIG. 1B is caused by a corresponding rise in source-substrate bias combined with the simultaneous reduction of drain-source bias. By eliminating the rise in the source substrate bias, the improved load characteristic of FIG. 1B is obtained since the reduction of drain-source bias is then solely responsible for turning the device off.

Figure 2:
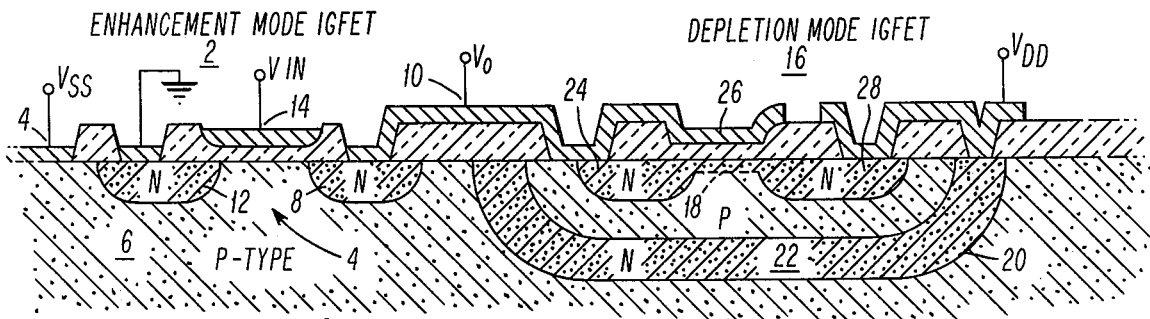
FIG. 2 is a cross-sectional structural diagram of the inverter circuit of FIG. 1A.

Shorting the source to the substrate of the depletion mode load device of FIG. 1A cannot be done with conventional enhancement/depletion mode IGFET inverter structures where both the active device 2 and the load device 16 share the same substrate. Instead, it is necessary to isolate the substrate of the load device 16 from that of the active device 2. This is done as shown in FIG. 2, by using an isolating diffusion 22 tied to a reverse biasing voltage supply $V_{DD}$. FIG. 2 shows the arrangement for a P type substrate.

Figure 6:
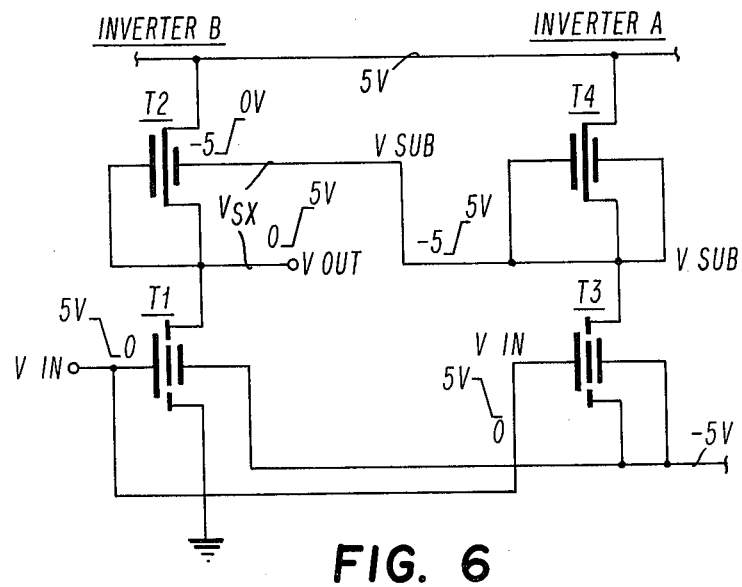
FIG. 6 is the schematic diagram of the substrate bias modulated circuit in accordance with the invention.

The invention disclosed herein improves upon the circuit of FIG. 1A by reducing the load device threshold voltage as the output voltage increases from its initial value. The circuit structure to accomplish this is shown in FIG. 6 and has an isolated substrate within which the FET load device T2 is located, that substrate being connected to a means for raising the voltage of the substrate of T2 as the source potential of T2 increases, that means being the inverter A. The particular circuit is shown in FIG. 6 and is a two-stage inverter. The first stage inverter A comprised of T3 and T4, can be a conventional FET inverter such as a linear load, saturated load or enhancement mode/depletion mode dype inverter with its input mode connected to the input signal source $V_{IN}$. The output of the first stage inverter T3, T4 is connected to the isolated substrate of the FET load T2 of a second inverter B comprised of T1 and T2, so that the FET load device T2 for the second stage inverter B has its isolated substrate modulated such that the potential of the isolated substrate changes at a faster rate than does the source potential. This tracking of the potential of the isolated substrate with respect to the potential of the source for the device T2, decreases the threshold voltage as the output voltage of the second stage increases. In a preferred embodiment, the first and second stages can include a depletion mode FET load device T2 and T4 having an isolated substrate.

In either PMOS or NMOS FET technologies, various basic circuit configurations have been proposed to improve the circuit performance. For example, in the NMOS inverter circuit, FIG. 3, the gate $V_{GL}$ of the load FET, when connected to its own drain, $V_{DD}$, gives a load characteristic 31 of FIG. 4. This is the saturated load configuration. Note that the decay of the current, when $V_{OUT}$ increases, is caused by:

a. a decrease in gate-to-source bias of the load device;
b. a decrease in the substrate-to-source bias resulting into the increase of the load device threshold voltage; and finally
c. a decrease in the drain-to-source bias which turns the current off in the load device.

Figure 3:
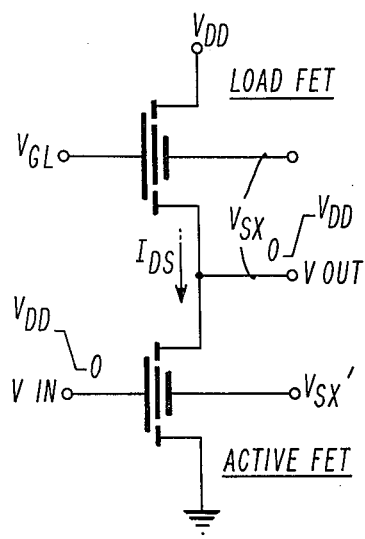
FIG. 3 is a schematic diagram of a generalized IGFET inverter circuit.

Improvements in the load characteristic of the generalized FET inverter of FIG. 3 could be achieved if the gate of the load device were connected to a power supply having a magnitude $V_{GL}$ greater than $V_{DD}$. The linear load thus obtained has a load characteristic 32 in FIG. 4. In this mode of operation the current decay is caused by the same factors described above for the saturated load except that since $V_{GL}$ is higher than $V_{DD}$, an improvement in the current through the load device is realized by reducing the relative variation in the gate-to-source bias.

Figure 4:
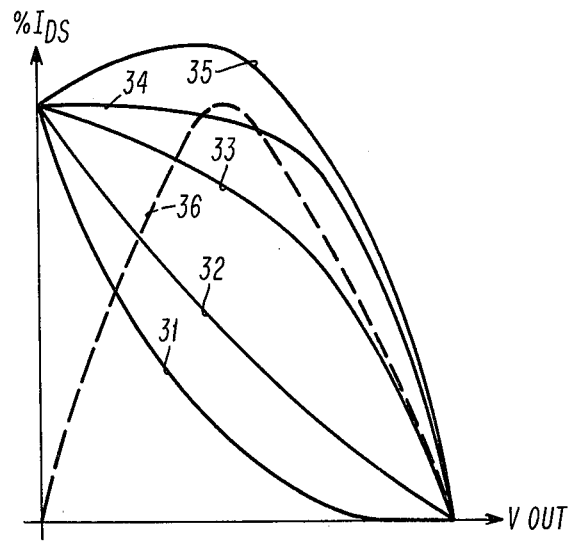
FIG. 4 illustrates the normalized load characteristics 31, 32, 33, 34 and 35 for the circuit of FIG. 3, for various load connections.

Yet another mode of operation for the generalized inverter of FIG. 3 is the use of a depletion mode load device which has a negative threshold voltage so that by connecting the gate of the load device to its source, the load characteristic 33 of FIG. 4 is obtained. The decay in current is thus eliminated due to factor (a) of the saturated load mentioned above since the load device gate-to-source voltage is constant at zero volts. The device operation is initially in the saturated region with the current being proportional to the square of the threshold voltage. As $V_{OUT}$ increases, the source-to-substrate bias decreases and the threshold voltage thereby increases, causing a decay in the current. A switching off action takes place since the drain-to-source bias thereby reduces to zero volts.

However, if the FET load device in the generalized inverter of FIG. 3 has an isolated substrate as is the case for the thin film FETs as disclosed in "Physics of Semiconductor Devices" by S. M. Sze, published by John Wiley, N.Y., 1969, pages 568–586, or a recently disclosed hybrid technology disclosed in "High Performance E-D MOS-Bipolar Technology" U.S. Pat. application Ser. No. 723,678, filed Sept. 16, 1976 by F. H. De La Moneda, et al., the substrate-to-source bias could be maintained constant by connecting the substrate to its own source. The resulting load characteristic 34 in FIG. 4, then only depends on the device characteristic, which is governed by the fundamental laws of device operation.

A further improvement in the load device characteristic is now achieved in accordance with this invention by reducing the FET load device threshold voltage as $V_{OUT}$ increases from its initial value of about zero volts. Since the drain/source current magnitude depends on the square of the threshold voltage for the isolated substrate, decreasing threshold voltage as $V_{OUT}$ increases from zero volts significantly enhances the current so as to yield the load characteristic 35 shown in FIGS. 4 and 5.

Figure 5:
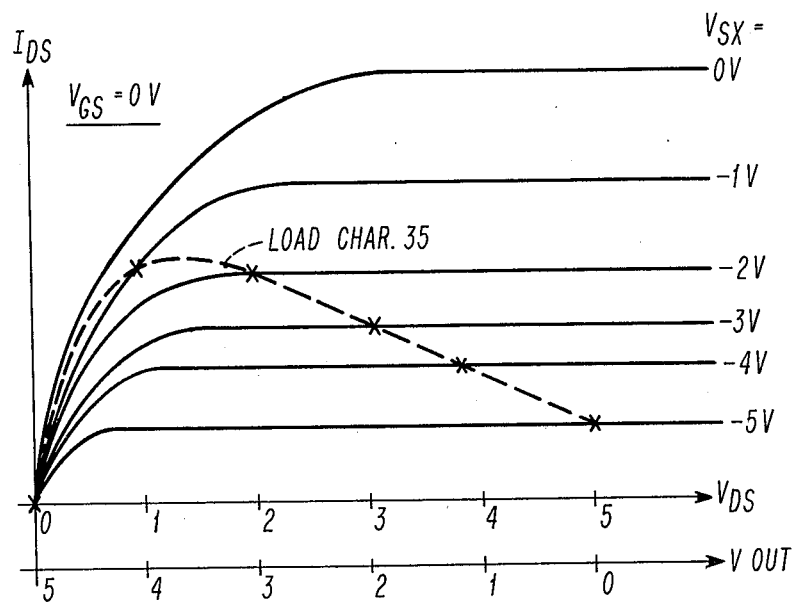
FIG. 5 illustrates the output characteristics of the load device T2 in FIG. 6, for various source-to-substrate biases.

This may be understood better when we consider FIG. 5 which plots drain-source currents ($I_{DS}$) against the drain-source voltage ($V_{DS}$) for various source-substrate biases with $V_{GS} = 0V$, for the load device T2 of the FET inverter B of FIG. 6.

Assuming $V_{DD} = 5V$ and $V_{SX} = -5V$, the $V_{OUT} \sim 0V$ when $V_{IN} = 5V$. As $V_{SX}$ is increased while $V_{OUT}$ increases, for example both by same magnitude, the magnitude of the resulting drain/source currents are shown by "X" in FIG. 5 as the load current 35. Curve 35 illustrates that by modulating the isolated substrate of T2, a greater current carrying capacity for the device is obtained in the later portion of its turn-on operation.

An application of this invention is in off chip drivers which require enhanced driving capabilities. One way to implement this concept is shown in FIG. 6 which has the basic depletion mode inverter B with its T2 load device's isolated substrate connected to inverter A's output $V_{SUB}$ and the input node's connected to the input signal source $V_{IN}$.

Inverter A is connected with the source and substrate of T3 connected to a substrate potential of −5 volts, for example so that the output voltage swing $V_{SUB}$ will be from the substrate potential of −5 volts to the drain potential of +5 volts. This larger voltage swing of $V_{SUB}$ is applied to the isolated substrate of T2 so that the source-to-substrate diode bias is always a reverse bias.

When $V_{IN} = 5V$, $T_1$ is ON and $V_{OUT} \sim 0V$ for inverter B. Correspondingly, $T_3$, which has a threshold voltage of over 5V (which can be achieved using ion-implantation or thick gate insulators) turns on so that $V_{SUB} = -5V$ for inverter A. Since $V_{SUB} = -5V$ and $V_{OUT} \sim 0V$, the load device $T_2$ has a $V_{SX} = -5V$. At the other extreme, when $V_{IN} \sim 0V$, $T_1$ is OFF and $V_{OUT} = 5V$, $T_3$ is also off and $V_{SUB} = 5V$. Since $V_{SUB} = 5V$ and $V_{OUT} = 5V$, $V_{SX}$ for $T_2$ is zero volts. Values of various biases, for illustration purposes, are shown in Table I below as $V_{IN}$ switches from 5V to 0V.

TABLE I

| $V_{IN}$ VOLTS | $V_{OUT}$ VOLTS | $V_{SUB}$ VOLTS | $V_{SX}$ VOLTS | $V_T$ VOLTS | $V_T'$ VOLTS |
|---|---|---|---|---|---|
| 5 | 0 | −5 | −5 | −2.0 | 0.2 |
| 4 | 1 | −3 | −4 | −2.2 | 0.0 |
| 3 | 2 | −1 | −3 | −2.4 | −0.2 |
| 2 | 3 | 1 | −2 | −2.6 | −0.4 |
| 1 | 4 | 3 | −1 | −2.8 | −0.6 |
| 0 | 5 | 5 | 0 | −3.0 | −0.8 |

It is seen from Table I that as $V_{IN}$ decreases from 5 volts to zero volts, the inverter generates a voltage increase for $V_{SUB}$ of from −5 volts to +5 volts. At the same time, inverter B generates a voltage increase for $V_{OUT}$ of from zero volts to +5 volts, this being the potential swing for the gate and the source of T2. The source-to-substrate voltage $V_{SX}$ for T2 thus swings from −5 volts to zero volts, tracking the voltage swing in $V_{OUT}$, of the source and gate of T2. This causes the threshold voltage $V_T$ for the load device T2 to decrease from approximately −2.0 volts to −3.0 volts as the magnitude of $V_{OUT}$ approaches its maximum value, a progressively greater quantity of current can be passed by the load device T2, thereby yielding the characteristic curve 35 of FIG. 4, with a greater driving capacity during the switching period of the device.

An alternate way of using this concept is to adjust the threshold voltage $V_T'$ of $T_2$ by ion-implantation in the gate region of T2, so that during the switching cycle when $V_{IN}$ goes from 5 volts to zero volts, $V_T'$ changes from 0.2 volts to −0.8 volts. This will yield the load characteristic 36, FIG. 4. The threshold voltage, $V_T'$, variation is shown in the above Table I.

Other alternatives can be employed for the load device T2 which, however, do not provide as much of an improvement in the load curve characteristic. For example, device T2 can be a linear load with its gate connected to a load voltage equal to or higher than the drain potential. Or alternately, T2 can be an enhancement mode FET with its gate connected to its drain.

Figure 7:
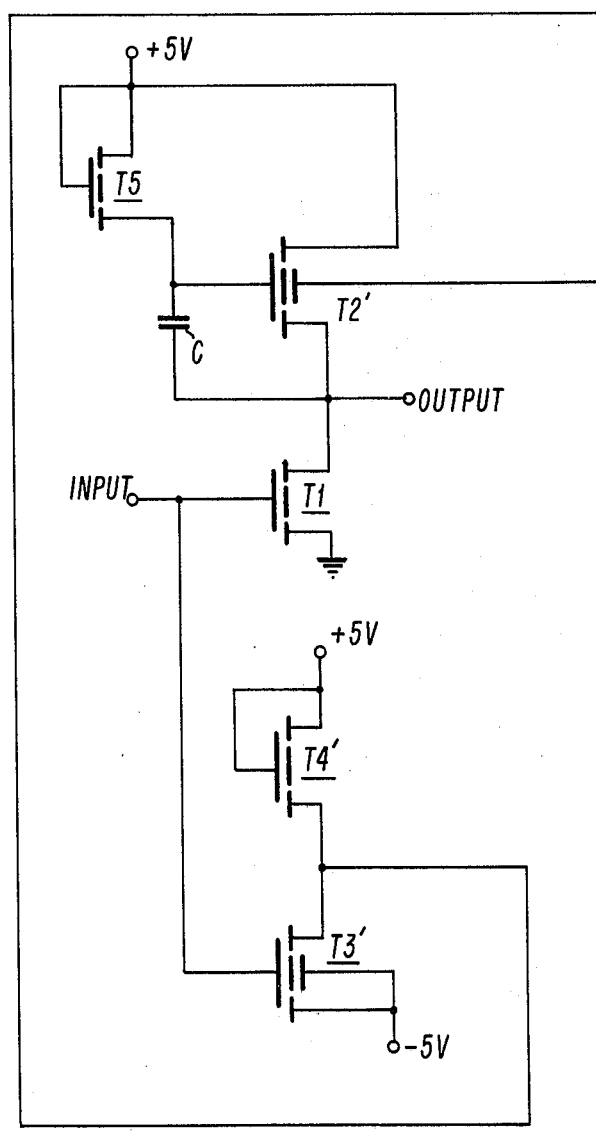
FIG. 7 shows the application of the substrate modulation principle to a bootstrap-type load device.

To summarize, this invention discloses a technique for enhancing circuit performance for isolated FET substrate technologies by modulating the substrate bias of a FET load device. In present forms, circuit performance enhancements are achieved by enhancing the gate voltages of the load device by using circuits such as a bootstrap, as disclosed in U.S. Pat. No. 3,506,851 to Polkinghorn, et al. Superimposing the above described substrate modulation on these bootstrap circuits, for substrate isolation technologies, further enhances their circuit performance. An example of an all enhancement mode FET bootstrap circuit with load device T2 having its substrate modulated in accordance with the subject invention, is shown in FIG. 7. It can be seen that a conventional bootstrap circuit of devices T2, T5 and C in FIG. 7 can be substituted for the load device $T_4'$ of the modulating signal source in FIG. 7, to achieve an even faster modulation of the substrate of $T_2'$.

While the invention has been particularly shown and described with reference to the preferred embodiments thereof, it will be understood by those skilled in the art that the foregoing and other changes in form and details may be made therein without departing from the spirit and scope of the invention.

We claim:

1. An improved FET inverter, comprising:
    an active FET device having its gate connected to an input source, its source connected to ground potential and its drain connected to an output node;
    an FET load device having an isolated substrate, with its source connected to said output node and its drain connected to a drain potential;
    a modulating signal source connected to said isolated substrate, which increases the isolated substrate's potential at a greater rate than the output potential at said output node increases;
    whereby the load device threshold voltage is reduced as the output voltage at said output node increases from its initial value, thereby improving the load curve characteristics for the inverter.

2. The circuit of claim 1, wherein said substrate modulating signal source further comprises:
    a second active FET device having its gate connected to said input signal source, its source and substrate connected to the substrate of said first active FET device, and its drain connected to a second node;
    a second FET load device having an isolated substrate with its gate, source and substrate connected to said second node, and its drain connected to said drain potential;
    said second node being connected to said isolated substrate for said first FET load device;
    whereby a modulated substrate voltage is supplied to the substrate of said first FET load device, which increases as the output potential at said output node voltage increases.

3. The circuit of claim 1, wherein said substrate modulating signal source comprises:
    an inverter having an input connected to said input signal source and an output connected to said isolated substrate for said first FET load device;
    whereby a modulated substrate voltage is supplied to the isolated substrate of said first FET load device, which increases as the output potential at said output node increases.

4. The circuit of claim 3, wherein said inverter comprises:
    a second active FET device having its gate connected to said input signal source, its source connected to a source potential, and its drain connected to a second node;
    a second FET load device having its source connected to said second node, and its drain connected to said drain potential;
    said second node being connected to said isolated substrate for said first FET load device;
    whereby a modulated substrate voltage is supplied to the isolated substrate of said first FET load device, which increases as the output potential at said output node increases.

5. The circuit of claim 4, wherein said second FET load comprises:

a linear load FET having its gate connected to a load gate voltage.

6. The circuit of claim 4, wherein said second FET load comprises:
a saturated load device having its gate connected to its drain.

7. The circuit of claim 4, wherein said second FET load comprises:
a saturated load device having its gate connected to its source.

8. The circuit of claim 7, wherein said second FET load comprises a depletion mode FET device.

9. The circuit of claim 4, wherein said second active FET device further comprises:
said source of said second active device being connected to its substrate;
whereby the output voltage at said second node swings from said source potential of said second active device to said drain potential of said second load device.

10. The circuit of claim 1, which further comprises:
a third FET device having its drain connected to a drain potential and its source connected to said gate of said FET load device, as a charging source;
said FET load device having a capacitance between its gate and source electrodes, which is charged by said third FET device;
whereby said inverter operates in the bootstrap mode.

11. The circuit of claim 10, wherein said substrate modulating signal source further comprises:
a second active FET device having its gate connected to said input signal source, its source connected to a source potential, and its drain connected to a second node;
a second FET load device having a source and substrate connected to said second node and its drain connected to said drain potential;
said second node being connected to said isolated substrate for said first FET load device;
whereby a modulated substrate voltage is supplied to the isolated substrate of said first FET load device, which increases as the output potential at said output node increases.

12. The circuit of claim 11, wherein said substrate modulating signal source further comprises:
a fourth FET device having its drain connected to a drain potential and its source connected to the gate of the second FET load device, as a charging source;
said second FET load device having a capacitance between its gate and source electrodes which is charged by said fourth FET device;
whereby said modulating signal source operates in a bootstrap mode.

13. The circuit of claim 1, wherein said FET load comprises:
a linear load FET having its gate connected to a load gate voltage.

14. The circuit of claim 1, wherein said FET load comprises:
a saturated load device having its gate connected to its drain.

15. The circuit of claim 1, wherein said FET load comprises:
a saturated load device having its gate connected to its source.

16. The circuit of claim 15, wherein said FET load comprises a depletion mode FET device.

* * * * *